(12) United States Patent
Su et al.

(10) Patent No.: US 12,002,737 B2
(45) Date of Patent: Jun. 4, 2024

(54) ELECTRONIC PACKAGE AND METHOD OF FABRICATING THE SAME

(71) Applicant: Siliconware Precision Industries Co., Ltd., Taichung (TW)

(72) Inventors: Pin-Jing Su, Taichung (TW); Cheng-Kai Chang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 45 days.

(21) Appl. No.: 16/568,990

(22) Filed: Sep. 12, 2019

(65) Prior Publication Data
US 2020/0365489 A1    Nov. 19, 2020

(30) Foreign Application Priority Data
May 14, 2019    (TW) .................................. 108116577

(51) Int. Cl.
| | |
|---|---|
| *H01L 23/48* | (2006.01) |
| *H01L 21/56* | (2006.01) |
| *H01L 23/00* | (2006.01) |
| *H01L 23/31* | (2006.01) |
| *H01L 23/498* | (2006.01) |

(52) U.S. Cl.
CPC .......... *H01L 23/481* (2013.01); *H01L 21/566* (2013.01); *H01L 23/3157* (2013.01); *H01L 23/49811* (2013.01); *H01L 23/49827* (2013.01); *H01L 24/33* (2013.01); *H01L 24/83* (2013.01)

(58) Field of Classification Search
CPC ............. H01L 23/481; H01L 23/49827; H01L 23/3157; H01L 23/147; H01L 23/49811; H01L 23/5385; H01L 21/566; H01L 21/56; H01L 21/6835; H01L 21/486; H01L 21/561
See application file for complete search history.

(56) References Cited

U.S. PATENT DOCUMENTS

| | | | |
|---|---|---|---|
| 2018/0204479 A1* | 7/2018 | Kim ......................... | G09B 7/02 |
| 2018/0204791 A1* | 7/2018 | Chen ................... | H01L 25/0652 |
| 2018/0358298 A1* | 12/2018 | Zhai ..................... | H01L 21/4853 |
| 2019/0341368 A1* | 11/2019 | Hu .......................... | H01L 24/96 |

* cited by examiner

*Primary Examiner* — Vongsavanh Sengdara
(74) *Attorney, Agent, or Firm* — Studebaker & Brackett PC (57) ABSTRACT

An electronic package is provided. The electronic package includes an encapsulating layer encapsulating a plurality of conductive pillars and an interposer board that has through-silicon vias. An electronic component is disposed on the encapsulating layer and electrically connected to the conductive pillars and the through-silicon vias. The conductive pillars act as an electric transmission path of a portion of electric functions of the electronic component. Therefore, the number of the through-silicon vias is reduced, and the fabrication time and chemical agent cost are reduced. Also, the through silicon interposer of a large area can be replaced by a smaller one, and the yield is increased. Further, a method of fabricating an electronic package is provided.

7 Claims, 10 Drawing Sheets

ELECTRONIC PACKAGE AND METHOD OF FABRICATING THE SAME

CROSS-REFERENCE TO RELATED APPLICATIONS

This application claims priority to Taiwanese Application Serial No. 108116577, filed on May 14, 2019. The entirety of the application is hereby incorporated by reference herein and made a part of this specification.

BACKGROUND

1. Technical Field

The present disclosure relates to package structures, and, more particularly, to an electronic package, a carrying board of the electronic package, and a method of fabricating the electronic package.

2. Description of the Prior Art

With the rapid development of electronic industry, electronic products are developed to have various functions and high performance. Currently, chip packaging technology includes a package module in a flip-chip manner, such as chip scale package (CSP), direct chip attached (DCA) or multi-chip module (MCM), a chip stacking technique that stacks and integrates chips into a 3D IC, or the like.

Figure 1:
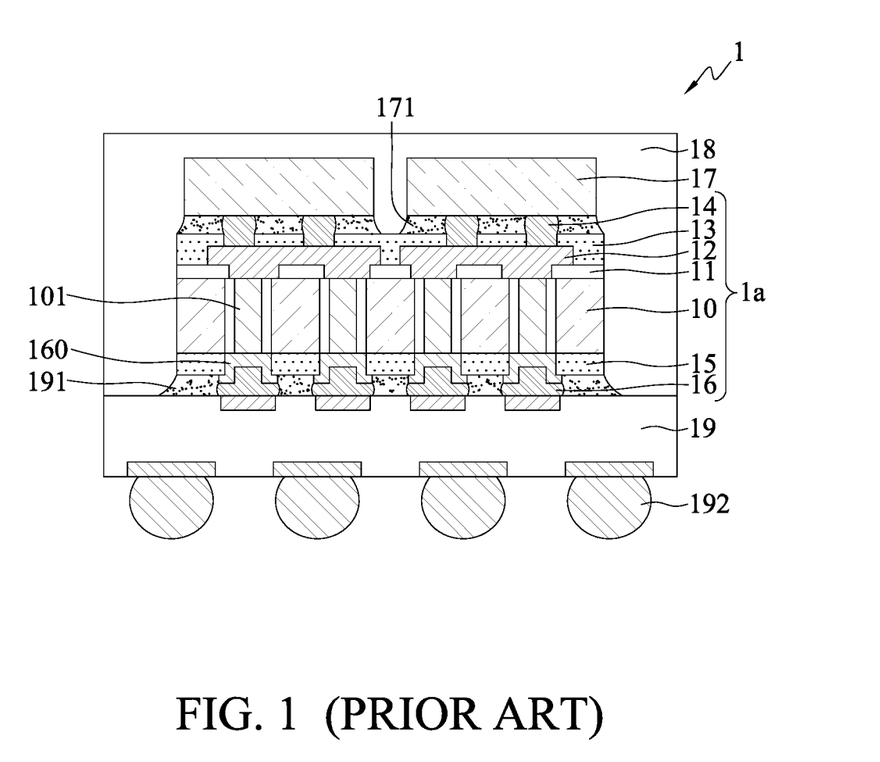
FIG. 1 is a cross-sectional schematic diagram of a package structure according to the prior art.

FIG. 1 is a cross-sectional schematic diagram of a package structure 1 in a 3D stack according to the prior art. The package structure 1 comprises a through silicon interposer (TSI) 1a having a silicon board body 10 and a plurality of through-silicon vias (TSVs) 101 formed therein. A redistribution layer (RDL) is formed on a surface of the silicon board body 10 and electrically connected to the through-silicon vias 101. The redistribution layer comprises a dielectric layer 11 and a wiring layer 12 formed on the dielectric layer 11. The wiring layer 12 is electrically connected to the through-silicon vias 101. An insulating protection layer 13 is formed on the dielectric layer 11 and the wiring layer 12, with a portion of the wiring layer 11 exposed from the insulating protection layer 13, for first conductive elements 14, such as a plurality of solder tin bumps, to be bonded thereto.

Another insulating protection layer 15 is formed on the silicon board body 10, with an end surface of the through-silicon vias 101 exposed from the insulating protection layer 15, for a plurality of second conductive elements 16 to be bonded thereto. The second conductive elements 16 are electrically connected to the through-silicon vias 101. The second conductive elements 16 contain a solder tin material or copper bumps. Optionally, an under bump metallurgy (UBM) 160 is disposed on the end surface of the through-silicon vias 101, for the second conductive elements 16 to be mounted thereto.

The package structure 1 further comprises a package substrate 19, for the through silicon interposer 1a to be mounted thereto via the second conductive elements 16. The package substrate 19 is electrically connected to the through-silicon vias 101. An under-fill 191 encapsulates the second conductive elements 16.

The package structure 1 further comprises a plurality of semiconductor chips 17 disposed on the first conductive elements 14 in a flip-chip manner and electrically connected to the wiring layer 12. The under-fill 171 encapsulates the first conductive elements 14. An encapsulant 18 is formed on the package substrate 19 and encapsulates the semiconductor chips 17 and the through silicon interposer 1a.

A plurality of solder balls 192 are disposed on a bottom side of the package substrate 19, for an electronic device (not shown), such as a circuit board, to be mounted thereto.

The more developed the electric functions of the end products are, the greater the number of the semiconductor chips 17 of the electronic component mounted on the through silicon interposer 1a becomes. Accordingly, the through silicon interposer 1a needs to have a larger and larger bonding area, and more and more the through-silicon vias 101 are disposed, which adversely affects the fabrication process as follows, and reduces the yield of the package structure 1.

The larger the volume of the through silicon interposer 1a is, the more mismatch of the coefficient of thermal expansions (CTE) between the under-fill 171 and the encapsulant 18 and the package substrate 19, the through silicon interposer 1a and the semiconductor chips 17 becomes, which results in an uneven thermal stress distribution. Accordingly, the through silicon interposer 1a suffers from a great warpage during a thermal cycle, the balls cannot be planted perfectly (i.e. the second conductive elements 16 are likely fell off and open circuited), the second conductive elements 16 have a non-wetting problem, or the package substrate 19 is likely cracked. Therefore, an end electronic product (e.g., a computer, a cellular phone, etc.) using the package structure 1 is not reliable.

The electric functions of the semiconductor chips 17 must be connected via the through silicon interposer 1a to the package substrate 19. The signal electric functions of the semiconductor chips 17 demand high transmission speed, to improve the performance of an end product. However, a portion of the electric functions (e.g., power or ground) of the semiconductor chips 17 does not demand high transmission speed. If the electric functions of power or ground are still transmitted via the through-silicon vias 101, unnecessary cost is wasted. For instance, through-silicon vias 101 that the electric functions of power or ground use have to be fabricated, and the area of the silicon board body 10 has to be increased. When the through-silicon vias 101 are fabricated, an aspect ratio (i.e., the aspect ratio of the through-silicon vias 101) has to be controlled specifically, in order to fabricate suitable through silicon interposer 1a. Therefore, a great amount of fabrication time and cost of chemical agent are needed, and the fabrication difficulty and fabrication cost are increased.

Therefore, how to overcome the problems of the prior art is becoming an urgent issue in the art.

SUMMARY

In view of the drawbacks of the prior art, the present disclosure provides an electronic package, comprising: an encapsulating layer; at least one interposer board embedded into the encapsulating layer and having a plurality of through-silicon vias; a plurality of conductive pillars disposed in the encapsulating layer; and at least one electronic component disposed on the encapsulating layer and electrically connected to the conductive pillars and the through-silicon vias.

In an embodiment, the encapsulating layer has a surface flush with a surface of the interposer board.

In an embodiment, the encapsulating layer has a surface flush with an end surface of the conductive pillars.

In an embodiment, the through-silicon vias are exposed from a surface of the encapsulating layer.

In an embodiment, the conductive pillars have an end surface exposed from a surface of the encapsulating layer.

In an embodiment, the electronic component is an active component, a passive component or a combination thereof.

In an embodiment, the electronic component is electrically connected via a wiring structure to the conductive pillars and the through-silicon vias.

In an embodiment, a wiring structure is disposed on the encapsulating layer and electrically connected to the conductive pillars and the through-silicon vias. In another embodiment, a plurality of conductive elements are disposed on the wiring structure, and electrically connected via the wiring structure to the conductive pillars and the through-silicon vias.

In an embodiment, a plurality of conductive elements are disposed on the encapsulating layer and electrically connected to the conductive pillars and the through-silicon vias.

The present disclosure also provides a method of fabricating an electronic package, comprising: providing an encapsulating layer embedded with a plurality of conductive pillars and at least one interposer board that has a plurality of through-silicon vias; and disposing an electronic component on one side of the encapsulating layer, and electrically connecting the electronic component to the conductive pillars and the through-silicon vias.

In an embodiment, the method further comprises: providing a first wiring structure; bonding the conductive pillars and the interposer board onto the first wiring structure, and electrically connecting the first wiring structure to the conductive pillars and the through-silicon vias; and bonding the encapsulating layer to the first wiring structure, and encapsulating the interposer board and the conductive pillars with the encapsulating layer.

In an embodiment, the method further comprises forming a second wiring structure on the encapsulating layer, wherein the electronic component is disposed on the second wiring structure, and electrically connecting the electronic component via the second wiring structure to the conductive pillars and the through-silicon vias.

In an embodiment, the method further comprises forming a plurality of conductive elements on the other side of the encapsulating layer and electrically connecting the plurality of conductive elements to the conductive pillars and the through-silicon vias.

The present disclosure further provides a method of fabricating an electronic package, comprising: providing an electronic component; bonding a plurality of conductive pillars and at least one interposer board that has a plurality of through-silicon vias onto the electronic component, and electrically connecting the conductive pillars and the through-silicon vias to the electronic component; and encapsulating the interposer board and the conductive pillars with an encapsulating layer.

In an embodiment, the method further comprises forming a first wiring structure on the encapsulating layer and electrically connecting the first wiring structure to the conductive pillars and the through-silicon vias.

In an embodiment, the method further comprises: forming a second wiring structure on the electronic component; bonding the conductive pillars and the interposer board onto the second wiring structure, and electrically connecting the second wiring structure to the conductive pillars and the through-silicon vias; and bonding the encapsulating layer onto the second wiring structure, and encapsulating the interposer board and the conductive pillars with the encapsulating layer.

In an embodiment, the method further comprises forming a plurality of conductive elements on the encapsulating layer, and electrically connecting the plurality of conductive elements to the conductive pillars and the through-silicon vias.

In an embodiment, the encapsulating layer has a first surface and a second surface opposing the first surface and flush with a surface of the interposer board.

In an embodiment, the encapsulating layer has a first surface and a second surface opposing the first surface and flush with an end surface of the conductive pillars.

In an embodiment, the encapsulating layer has a first surface and a second surface opposing the first surface, with the through-silicon vias exposed from the second surface of the encapsulating layer.

In an embodiment, the encapsulating layer has a first surface and a second surface opposing the first surface, with an end surface of the conductive pillars exposed from the second surface of the encapsulating layer.

In an embodiment, the electronic component is an active component, a passive component or a combination thereof.

In the electronic package and the method of fabricating the same according to the present disclosure, the conductive pillars act as an electric transmission path of a portion of electric functions (e.g., power of ground) of an electronic component, so as to reduce the number of the through-silicon vias fabricated. Compared with the prior art, the present disclosure reduces the fabrication time and cost of chemical agents, and has a higher yield by replacing an interposer board of a small size for a larger through silicon interposer of the prior art.

In the electronic package and the method of fabricating the same according to the present disclosure, the encapsulating layer encapsulates the interposer board, and the encapsulating layer and the encapsulant have matched coefficients of thermal expansion when the encapsulant is formed subsequently, and the thermal stress can be distributed evenly. Compared with the prior art, the present disclosure prevents the encapsulating layer from generating warpage during the thermal cycle, and avoids the poor ball planting scenario and reliability problems.

BRIEF DESCRIPTION OF THE DRAWINGS

FIGS. 2G' and 2G" are cross-sectional schematic diagrams corresponding to another embodiment of FIG. 2G.

FIG. 3A' is a cross-sectional schematic diagram corresponding to another embodiment of FIG. 3A.

FIGS. 3E' and 3E" are cross-sectional schematic diagrams corresponding to another embodiment of FIG. 3E.

DETAILED DESCRIPTION

The following illustrative embodiments are provided to illustrate the disclosure of the present disclosure. These and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. Changes or adjustments are considered to be within the scope of the present disclosure, without departing from the scope of the present disclosure. As used herein, the terminologies, such as "over," "first," "second," "a," and the like are used to distinguish one element from another, and are not intended to limit the scope of the present application. Changes or adjustments are considered to be within the scope of the present disclosure, without departing from the scope of the present disclosure.

FIGS. 2A to 2G are cross-sectional schematic diagrams illustrating a method of fabricating an electronic package 2 of a first embodiment according to the present disclosure.

Figure 2A:
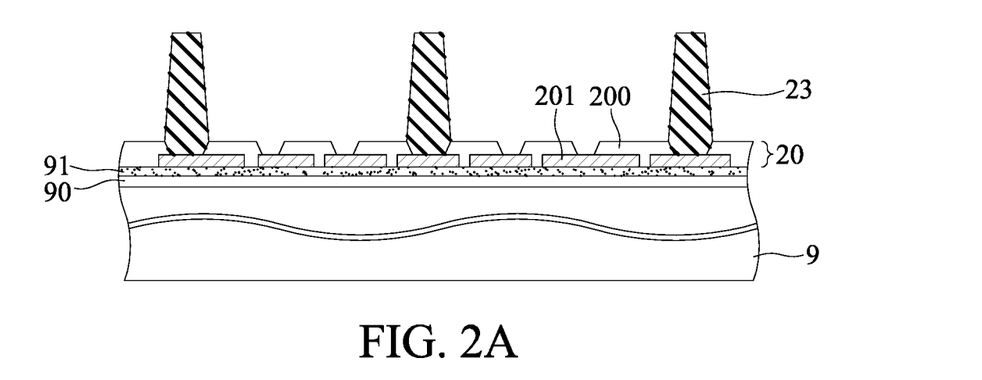
FIGS. 2A to 2G are cross-sectional schematic diagrams illustrating a method of fabricating an electronic package of a first embodiment according to the present disclosure.

As shown in FIG. 2A, a carrying board 9 provided with a first wiring structure 20 thereon is provided, and a plurality of conductive pillars 23 are disposed on the first wiring structure 20.

In an embodiment, the first wiring structure 20 comprises at least one first insulation layer 200 and at least one first redistribution layer (RDL) 201 disposed on the first insulation layer 200. In an embodiment, the first redistribution layer 201 is made of copper, and the first insulation layer 200 is made of polybenzoxazole (PBO), polyimide (PI), prepreg (PP) or other dielectric materials.

In an embodiment, the carrying board 9 is a board made of a semiconductor material (e.g., silicon or glass), a release layer 90 and an adhesion layer 91 are coated on the carrying board 9 subsequently, and the first wiring structure 20 can be disposed on the adhesion layer 91.

In an embodiment, the conductive pillars 23 are disposed on the first redistribution layer 201 and electrically connected to the first redistribution layer 201. In another embodiment, the conductive pillars 23 are made of metal, such as copper, or solder tin.

Figure 2B:
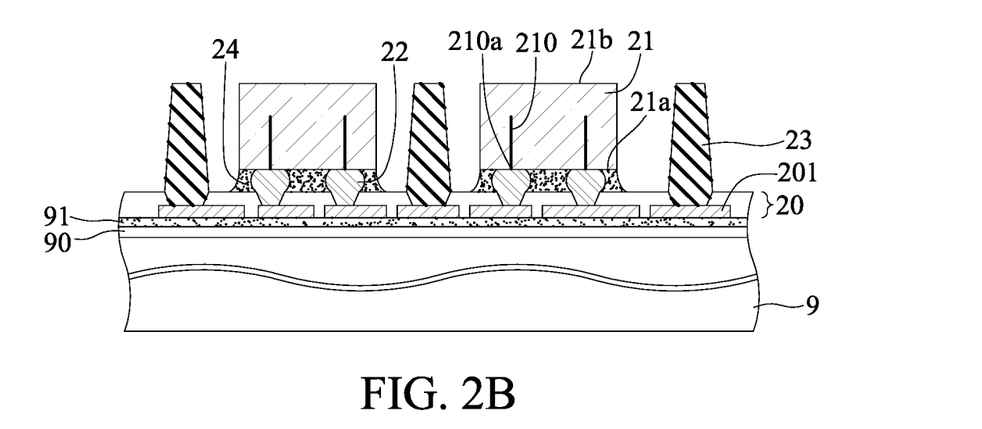

As shown in FIG. 2B, at least one interposer board 21 is disposed on the first wiring structure 20, and has a first side 21a and a second side 21b opposing the first side 21a.

In an embodiment, the interposer board 21 is a through silicon interposer (TSI), and has a plurality of through-silicon vias 210 exposed from the first side 21a. In an embodiment, the through-silicon vias 210 have pad portions at ends thereof.

The first side 21a of the interposer board 21 is bonded via a plurality of conductors 22 to the first wiring structure 20 using the exposed end surfaces 210a of the through-silicon vias 210 and electrically connected to the first redistribution layer 201. In an embodiment, the conductors 22 are conductive circuits, metal bumps, such as copper pillars, solder tin balls etc., stud conductors fabricated by a solder wire machine. In an embodiment, a bonding layer 24, such as an under-fill, encapsulates the conductors 22.

Figure 2C:
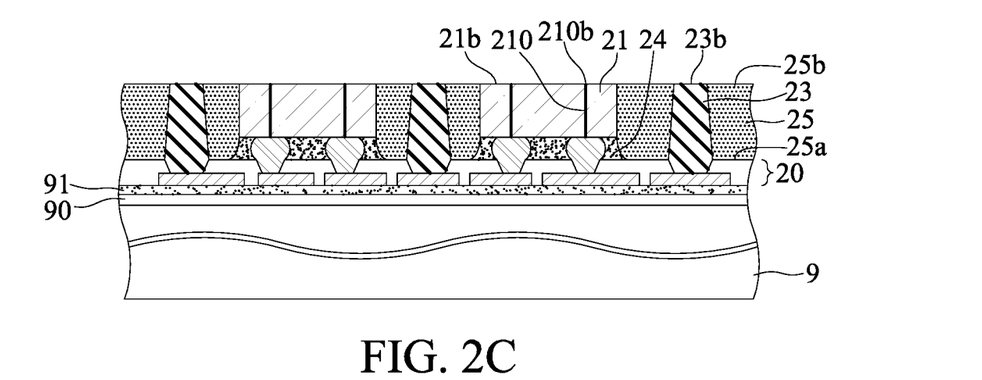

As shown in FIG. 2C, an encapsulating layer 25 is formed on the first wiring structure 20 and encapsulates the interposer board 21, the bonding layer 24 and the conductive pillars 23. In an embodiment, the encapsulating layer 25 has a first surface 25a bonded to the first wiring structure 20 and a second surface 25b opposing the first surface 25a. A leveling process is performed to flush the second surface 25b of the encapsulating layer 25 with an end surface 23b of the conductive pillars 23 and a second side 21b of the interposer board 21 (or another end surface 210b of the through-silicon vias 210), allowing the end surface 23b of the conductive pillars 23 and the second side 21b of the interposer board 21 (or the another end surface 210b of the through-silicon vias 210) to be exposed from the second surface 25b of the encapsulating layer 25.

In an embodiment, the encapsulating layer 25 is made of an insulation material, such as packaging resin of epoxy resin, and can be formed on the first wiring structure 20 by lamination or molding.

In the leveling process, a portion the conductive pillars 23, a portion of the second side 21b of the interposer board 21, and a portion of the encapsulating layer 25 are ground and removed.

Figure 2D:
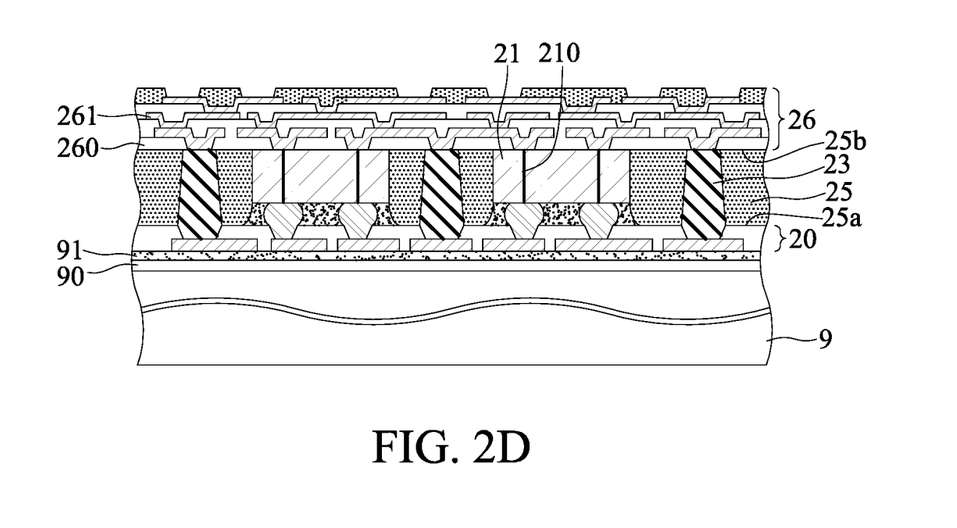

As shown in FIG. 2D, a second wiring structure 26 is disposed on the second surface 25b of the encapsulating layer 25, and the second wiring structure 26 is electrically connected to the conductive pillars 23 and the through-silicon vias 210 of the interposer board 21.

In an embodiment, the second wiring structure 26 comprises a plurality of second insulation layers 260 and a plurality of second RDLs 261 formed on the second insulation layer 260, an outermost one of the second insulation layer 260 acts as a solder resist layer, and an outermost one of the second RDLs 261 is exposed from the solder resist layer. In another embodiment, the second wiring structure 26 comprises a single second insulation layer 260 and a single second RDL 261.

In an embodiment, the second RDL 261 is made of copper, and the second insulation layer 260 is made of PBO, PI, PP or other dielectric materials.

Figure 2E:
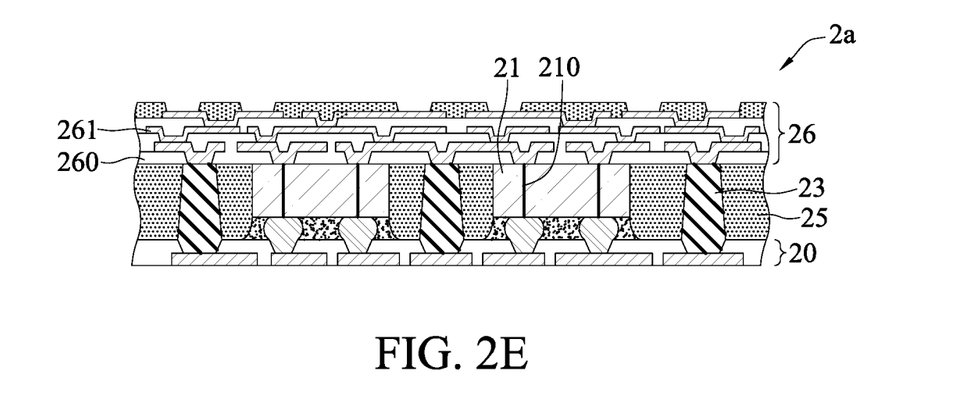

As shown in FIG. 2E, the carrying board 9 and the release layer 90 and the adhesion layer 91 thereon are removed, to expose the first wiring structure 20.

In an embodiment, the encapsulating layer 25, the interposer board 21 and the conductive pillars 23 can be an intermediate portion 2a, which can comprise the first wiring structure 20 and/or the second wiring structure 26 on demand.

Figure 2F:
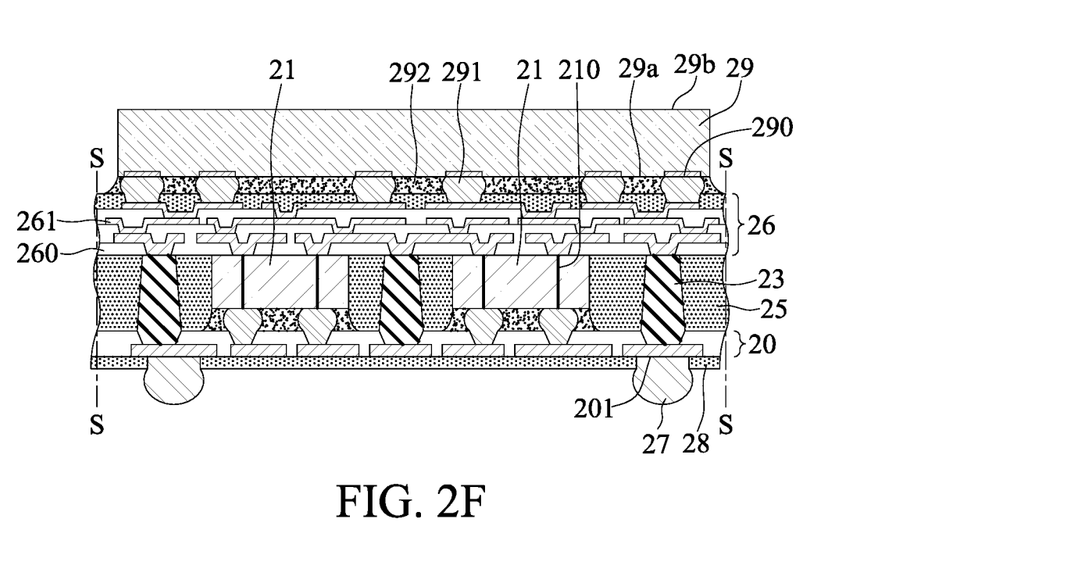

As shown in FIG. 2F, an electronic component 29 is disposed on an outermost one of the second RDLs 261, and conductive elements 27, such as solder balls, are disposed on the first wiring structure 20.

In an embodiment, an insulating protection layer 28, such as a solder resist layer, can be formed on the first wiring structure 20, and a plurality of apertures are formed on the insulating protection layer 28 and expose the first redistribution layer 201, for the conductive elements 27 to be bonded thereto.

In an embodiment, the electronic component 29 is an active component, such as a semiconductor chip (e.g. a logic chip), a passive component, such as a resistor, a capacitor or an inductor, or a combination thereof. In another embodiment, the electronic component 29 has an active surface 29a and an inactive surface 29b opposing the active surface 29a, and is disposed on the second RDL 261 in a flip-chip manner. Electrode pads 290 disposed on the active surface 29a are disposed on and electrically connected to the second RDL 261 via a plurality of conductive bumps 291 such as a solder tin material, and an under-fill 292 encapsulates the conductive bumps 291. In another embodiment, the inactive surface 29b of the electronic component 29 is disposed on the second wiring structure 26, and electrically connected to the second RDL 261 via a plurality of solder wires (not shown) in a wire bonding manner. In yet another embodiment, the electronic component 29 is electrically connected to the second RDL 261 via a conductive material (not shown), such as a conductive adhesive or a solder tin. In another embodiment, the electronic component 29 can be electrically connected to the second RDL 261 in other manners.

Figure 2G:
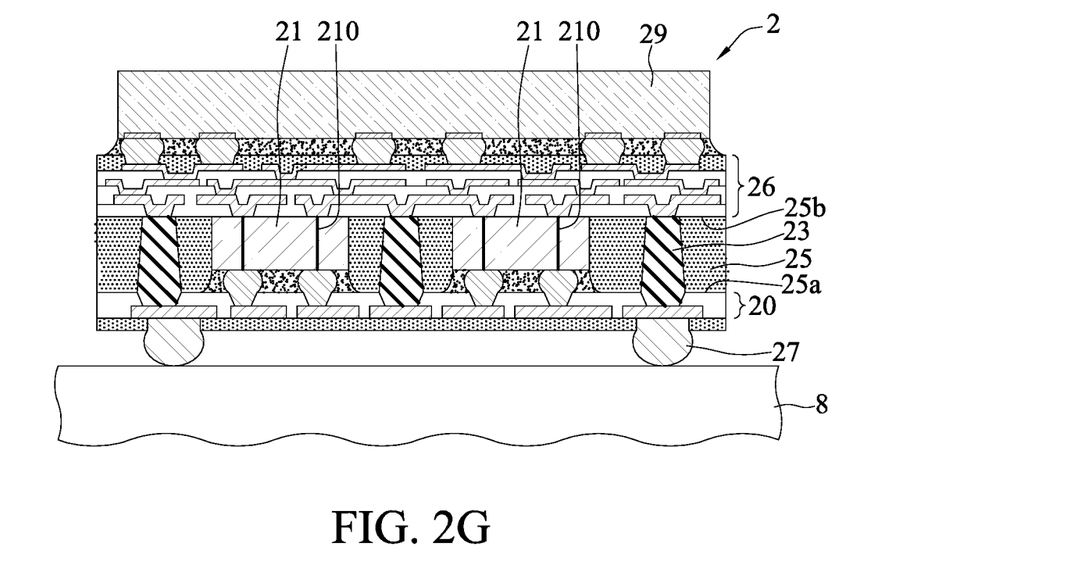

As shown in FIG. 2G, a singulation process is performed on the intermediate portion 2a along a cutting path S shown in FIG. 2F, to obtain the electronic package 2.

Figure 2H:
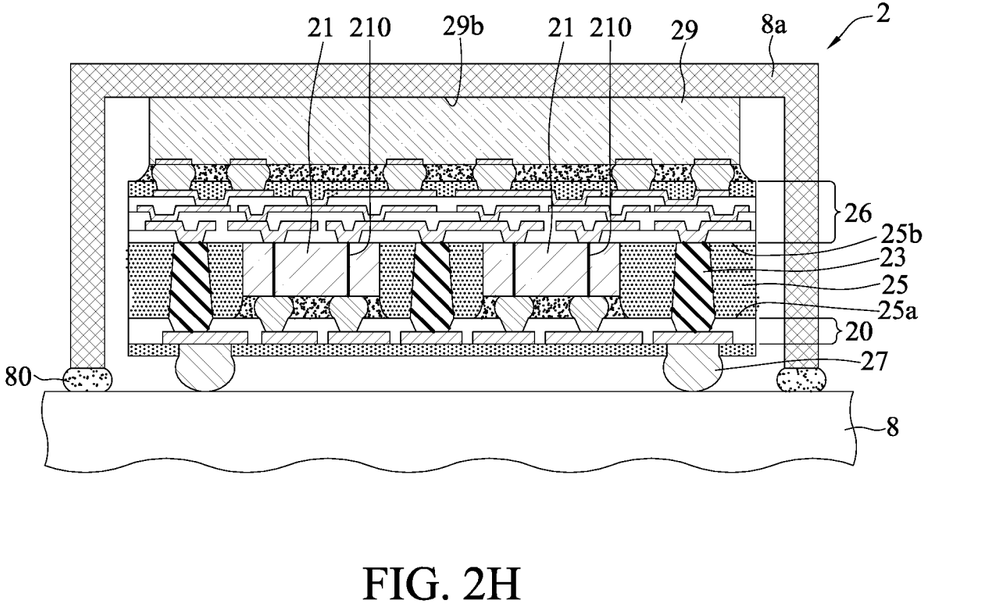
FIG. 2H is a cross-sectional schematic diagram illustrating a subsequent process of FIG. 2G.

In an embodiment, the conductive elements 27 can be mounted on an upper side of a layout board 8, such as an organic board (e.g., a package substrate having a core layer and a wiring portion, or a coreless package substrate having a wiring portion) or an inorganic board (e.g., a silicon board). In another embodiment, an electronic device, such as a circuit board (not shown), is mounted to a lower side of the layer board 8, and an encapsulant (not shown) is formed on the upper side of the layout board 8 and encapsulates the electronic package 2. As shown in FIG. 2H, a heat sink 8a is disposed on and bonded to the layout board 8 via the adhesion layer 80 on demands. The heat sink 8a is bonded to the inactive surface 29b of the electronic component 29.

In the electronic package 2' shown in FIG. 2G', the second wiring structure 26 is omitted, the electronic component 29 is mounted on the interposer board 21 and the conductive pillars 23, and the under-fill 292 is in contact with the second surface 25b of the encapsulating layer 25. In an embodiment, the electronic component 29 is electrically connected via the conductive bumps 291 to the through-silicon vias 210 and the conductive pillars 23.

In the electronic package 2" shown in FIG. 2G", the first wiring structure 20 is omitted, and the through-silicon vias 210 of the interposer board 21 and the conductive pillars 23 are mounted via the conductive elements 27 on the layout board 8.

Refer to FIGS. 3A to 3D, which are cross-sectional schematic diagrams illustrating a method of fabricating an electronic package 3 of a second embodiment according to the present disclosure. The second embodiment differs from the first embodiment in the disposition of an electronic component.

Figure 3A:
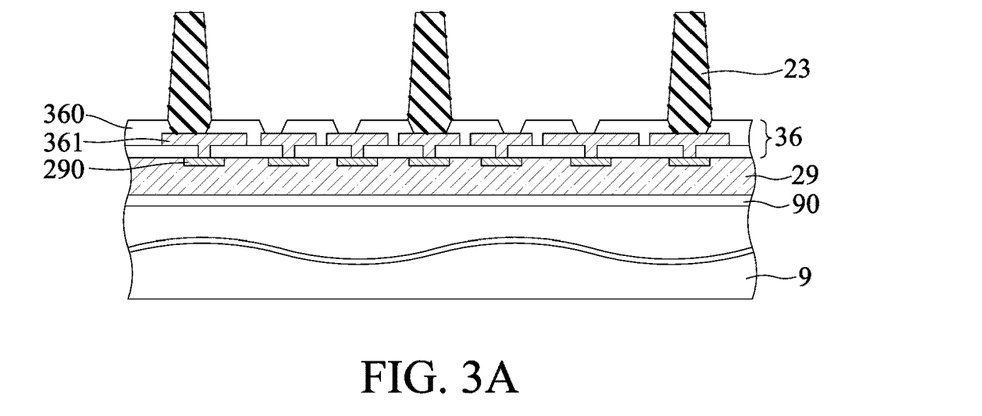
FIGS. 3A to 3E are cross-sectional schematic diagrams illustrating a method of fabricating an electronic package of a second embodiment according to the present disclosure.

As shown in FIG. 3A, an electronic component 29 is disposed on a release layer 90 (or an adhesion layer 91) on a carrying board 9, and a second wiring structure 36 that has a plurality of second insulation layer 360 and a plurality of second RDLs 361 disposed on the second insulation layer 360 is disposed on the electronic component 29.

In another embodiment, the second wiring structure 36 is omitted, and the conductive pillars 23 are mounted on the electrode pads 290 of the electronic component 29, as shown in FIG. 3A'.

Figure 3B:
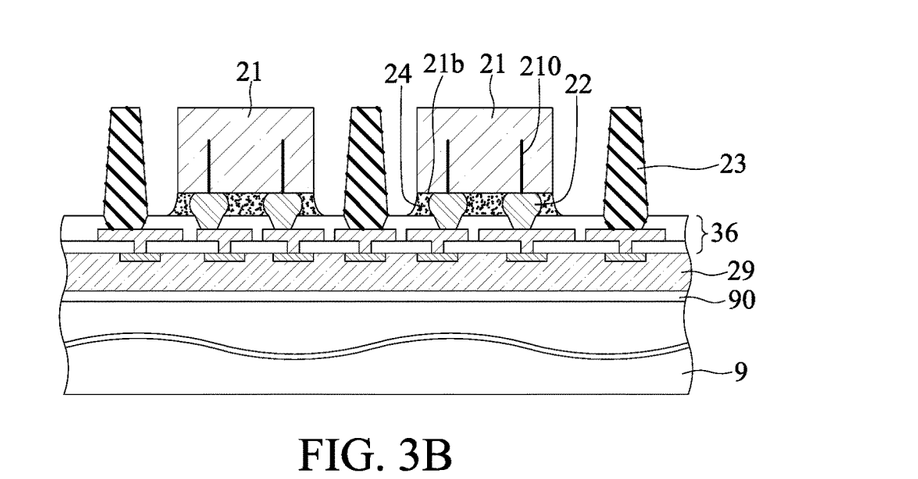

As shown in FIG. 3B, subsequent to the process of FIG. 3A, the second side 21b of the interposer board 21 is disposed via the conductors 22 and the bonding layer 24 on the second wiring structure 36.

Figure 3C:
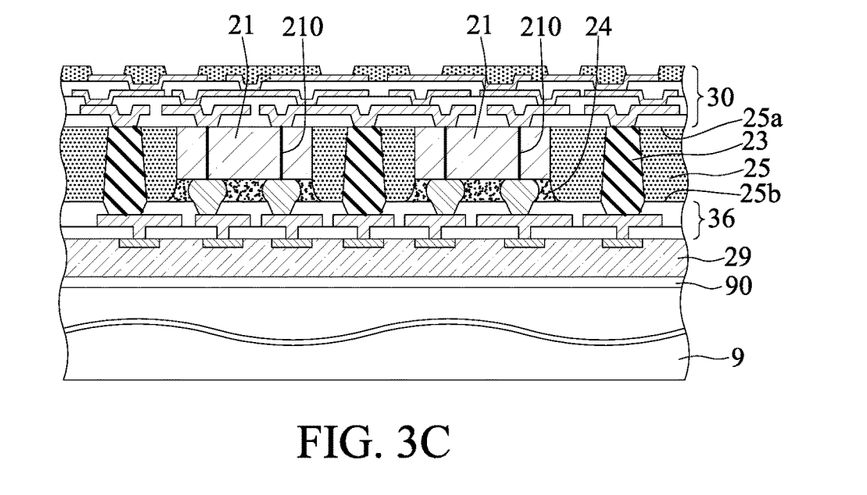

As shown in FIG. 3C, the encapsulating layer 25 encapsulates the interposer board 21, the bonding layer 24 and the conductive pillars 23, and a leveling process is then performed. Then, a first wiring structure 30 is disposed on the first surface 25a of the encapsulating layer 25 and electrically connected to the conductive pillars 23 and the through-silicon vias 210 of the interposer board 21.

Figure 3D:
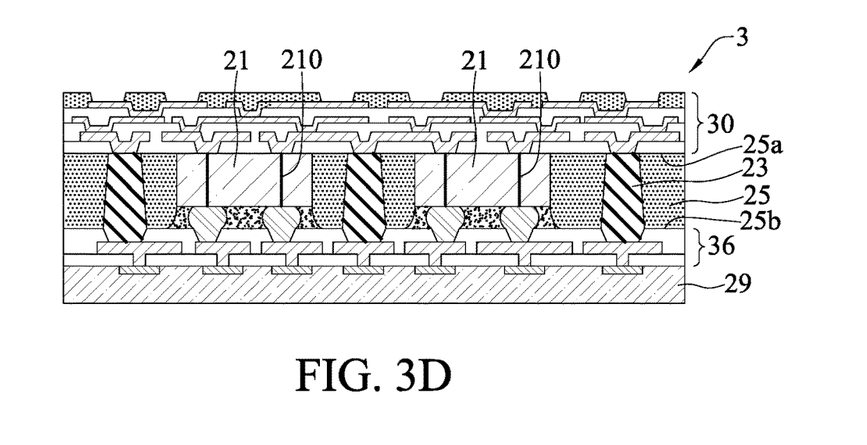

As shown in FIG. 3D, the carrying board 9 and the release layer 90 thereon are removed to expose the electronic component 29, and a singulation process is performed to obtain the electronic package 3.

Figure 3E:
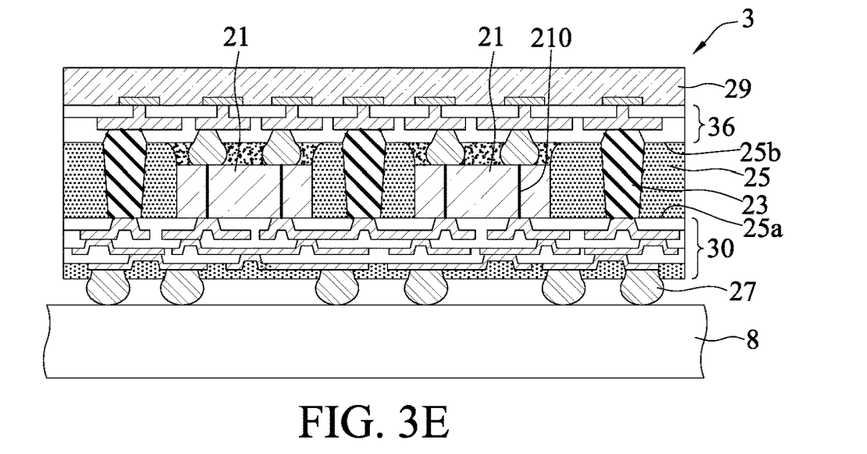

In an embodiment, the electronic package 3 is mounted via the conductive elements 27 on the layout board 8 (as shown in FIG. 3E), and the heat sink 8a (see FIG. 2G) can be disposed on the layout board 8 on demand.

If the process of FIG. 3A' is followed, the electronic package 3' shown in FIG. 3E' can be obtained, and the interposer board 21 is bonded and electrically connected via the conductors 22 to the electronic component 29. As shown in the process of FIG. 3A, the first wiring structure 30 can be omitted, and the conductive elements 27 are mounted on the through-silicon vias 210 and the conductive pillars 23, to form the electronic package 3" shown in FIG. 3E".

Figure 4:
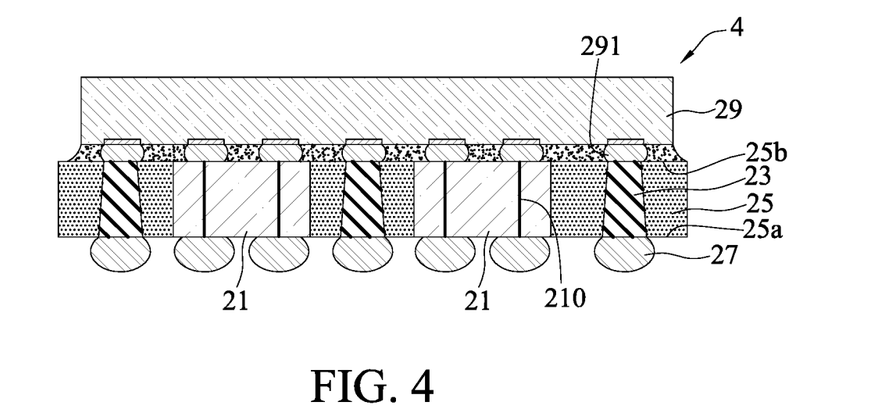
FIGS. 4 and 4' are cross-sectional schematic diagrams illustrating an electronic package of another embodiment according to the present disclosure.

In the first and second embodiments, the first wiring structure 20, 30 and the second wiring structure 26, 36 can be omitted, to form the electronic package 4, 4' shown in FIGS. 4 and 4'.

In a method of fabricating an electronic package according to the present disclosure, the conductive pillars 23, which have a very low fabrication cost (e.g., a copper pillar fabricating process used in a general packaging process) act as the electric transmission structure between the electronic component 29 and the layout board 8. Compared with the prior art, the electronic package 2, 2', 2", 3, 3', 3", 4, 4' according to the present disclosure can have fewer through-silicon vias 210, even if a great number of electronic components 29 are disposed on the intermediate portion 2a. Therefore, the fabrication time, cost of chemical agent, the fabrication difficulty and the fabrication cost are reduced, and the yield is increased.

In a method of fabricating an electronic package according to the present disclosure, the interposer board 21 of a small size replaces the large through silicon interposer. Therefore, as compared with the yield of a single large size through silicon interposer of the prior art (e.g., the yield of fabricating ten TSVs is $0.9^{10}$), the yield of the interposer board 21 according to the present disclosure is higher (e.g., the yield of a single interposer board 21 having five TSV fabricated is $0.9^5$), which results in a higher yield of the overall intermediate portion 2a (the yield of the whole 10 TSVs is $0.9^5$).

According to the present disclosure, the encapsulating layer 25 encapsulates the interposer boards 21. Therefore, when the encapsulant is formed, the encapsulating layer 25 and the encapsulant have matched CTEs, and the thermal stress can be distributed evenly. During the thermal cycle, the intermediate portion 2a does not generate warpage, the conductive elements 27 are not likely fell off and open circuited, the conductive elements 27 do not have a non-wetting problem, and the layout board 8 is not likely cracked. Therefore, an end electronic product (e.g., a computer, a cellular phone, etc.) using the package structure 1 is reliable.

According to the present disclosure, a portion of electric functions of the electronic component 29 (e.g., power or ground) acts as an electric transmission path via the conductive pillars 23. Therefore, the present disclosure does not need to fabricate a large interposer board 21, and has a lower fabrication cost, as compared with the prior art.

The present disclosure also provides an electronic package 2, 2', 2", 3, 3', 3", 4, 4', which comprises an encapsulating layer 25, at least one interposer board 21, a plurality of conductive pillars 23 and at least one electronic component 29.

The encapsulating layer 25 has a first surface 25a and a second surface 25b opposing the first surface 25a.

The interposer board 21 is embedded in the encapsulating layer 25, and has a first side 21a, a second side 21b opposing the first side 21a, and a plurality of through-silicon vias 210 in communication with the first side 21a and the second side 21b.

The conductive pillars 23 are disposed in the encapsulating layer 25 and in communication with the first surface 25a and the second surface 25b of the encapsulating layer 25.

The electronic component 29 is disposed on the second surface 25b of the encapsulating layer 25, and electrically connected to the conductive pillars 23 and the through-silicon vias 210.

In an embodiment, the first surface 25a of the encapsulating layer 25 is flush with a surface of the first side 21a of the interposer board 21 (as shown in FIGS. 2G", 3E, 3E", 4 and 4'). In another embodiment, the second surface 25b of the encapsulating layer 25 is flush with a surface of the second side 21b of the interposer board 21 (as shown in FIGS. 2G, 2G', 3E', 4 and 4').

In an embodiment, the first surface 25a of the encapsulating layer 25 is flush with the end surface 23a of the conductive pillars 23 (as shown in FIGS. 2G", 3E, 3E", 4 and 4'). In another embodiment, the second surface 25b of the encapsulating layer 25 is flush with the end surface 23b of the conductive pillars 23 (as shown in FIGS. 2G, 2G', 3E', 4 and 4').

In an embodiment, the through-silicon vias 210 are exposed from the first surface 25a or the second surface 25b of the encapsulating layer 25.

In an embodiment, the end surface 23a of the conductive pillars 23 is exposed from the first surface 25a of the encapsulating layer 25. In another embodiment, the end surface 23b of the conductive pillars 23 is exposed from the second surface 25b of the encapsulating layer 25.

In an embodiment, the electronic component 29 is an active component, a passive component or a combination thereof.

In an embodiment, the electronic component 29 is electrically connected via the second wiring structure 26, 36 to the conductive pillars 23 and the through-silicon vias 210.

In an embodiment, the electronic package 2, 2', 3, 3' further comprises the first wiring structure 20, 30 and/or the second wiring structure 26, 36 disposed on the encapsulating layer 25 and electrically connected to the conductive pillars 23 and the through-silicon vias 210. In an embodiment, a plurality of conductive elements 27 are disposed on the first wiring structure 20, 30 of the encapsulating layer 25 and electrically connected via the first wiring structure 20, 30 to the conductive pillars 23 and the through-silicon vias 210.

In an embodiment, the electronic package 2", 3", 4, 4' further comprises a plurality of conductive elements 27 disposed on the first surface 25a of the encapsulating layer 25 and electrically connected to the conductive pillars 23 and the through-silicon vias 210.

In an electronic package and a method for fabricating the same according to the present disclosure, the conductive pillars and the interposer board are embedded in the encapsulating layer to act as the intermediate portion, to reduce the number of through-silicon vias in the interposer board. Therefore, the present disclosure can reduce the cost and increase the yield.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
   an encapsulating layer;
   at least one interposer board embedded into the encapsulating layer and having a plurality of through-silicon vias;
   a plurality of conductive pillars disposed in the encapsulating layer and free from being formed in the at least one interposer board and any interposer board, wherein the plurality of conductive pillars are in direct contact with the encapsulating layer and are free from being in direct contact with the at least one interposer board and the plurality of through-silicon vias, wherein a surface of the encapsulating layer, a surface of the at least one interposer board, end surfaces of the plurality of through-silicon vias and end surfaces of the plurality of conductive pillars are horizontally coplanar; and
   at least one semiconductor chip as an electronic component disposed on the encapsulating layer and electrically connected to the plurality of conductive pillars and the plurality of through-silicon vias by a plurality of conductive bumps, wherein the plurality of conductive bumps are in direct contact with the electronic component, the plurality of conductive pillars, and the plurality of through-silicon vias, and the electronic component is free from being embedded in the encapsulating layer.

2. The electronic package of claim 1, wherein the plurality of through-silicon vias or an end surface of the plurality of conductive pillars are exposed from a surface of the encapsulating layer.

3. The electronic package of claim 1, wherein an active component, a passive component or a combination thereof is disposed on the encapsulating layer.

4. The electronic package of claim 1, further comprising a wiring structure electrically connecting the electronic component to the conductive pillars and the through-silicon vias.

5. The electronic package of claim 1, further comprising a wiring structure disposed on the encapsulating layer and electrically connected to the plurality of conductive pillars and the plurality of through-silicon vias.

6. The electronic package of claim 5, further comprising a plurality of conductive elements disposed on the wiring structure and electrically connected via the wiring structure to the plurality of conductive pillars and the plurality of through-silicon vias.

7. The electronic package of claim 1, further comprising a plurality of conductive elements disposed on the encapsulating layer and electrically connected to the conductive pillars and the through-silicon vias.

* * * * *